(12) United States Patent
Seibold et al.

(10) Patent No.: US 6,890,699 B2
(45) Date of Patent: May 10, 2005

(54) POLYMER MATERIAL HAVING A LOW GLASS TRANSITION TEMPERATURE FOR USE IN CHEMICALLY AMPLIFIED PHOTORESISTS FOR SEMICONDUCTOR PRODUCTION

(75) Inventors: Kerstin Seibold, Nürnberg (DE); Oliver Kirch, Erlangen (DE)

(73) Assignee: Infineon Technologies AG, Munich (DE)

( * ) Notice: Subject to any disclaimer, the term of this patent is extended or adjusted under 35 U.S.C. 154(b) by 60 days.

(21) Appl. No.: 10/377,893

(22) Filed: Feb. 28, 2003

(65) Prior Publication Data

US 2003/0162411 A1 Aug. 28, 2003

(30) Foreign Application Priority Data

Feb. 28, 2002 (DE) .......................... 102 08 754

(51) Int. Cl.⁷ .............................. G03F 7/004
(52) U.S. Cl. ................ 430/270.1; 430/286.1; 430/311; 430/313; 430/330; 438/780
(58) Field of Search .................. 430/286.1, 270.1, 430/311, 313, 330; 438/780

(56) References Cited

U.S. PATENT DOCUMENTS

| | | | |
|---|---|---|---|
| 5,234,793 A | | 8/1993 | Sebald et al. |
| 6,165,682 A | * | 12/2000 | Foster et al. ............. 430/270.1 |
| 6,171,755 B1 | * | 1/2001 | Elian et al. ............. 430/270.1 |
| 6,291,129 B1 | * | 9/2001 | Shida et al. ............. 430/270.1 |
| 6,410,748 B1 | * | 6/2002 | Shida et al. ............. 548/475 |
| 6,514,663 B1 | * | 2/2003 | Hien et al. ............. 430/270.1 |
| 6,517,993 B2 | * | 2/2003 | Nakamura et al. ....... 430/270.1 |
| 6,555,289 B2 | * | 4/2003 | Sasaki et al. ............ 430/270.1 |

FOREIGN PATENT DOCUMENTS

| | | |
|---|---|---|
| DE | 101 34 163 A1 | 1/2002 |
| DE | 101 34 162 A1 | 4/2002 |
| EP | 0 395 917 B1 | 11/1990 |
| EP | 0 919 867 A2 | 6/1999 |
| JP | 11231542 A * | 8/1999 ........... G03F/7/039 |

OTHER PUBLICATIONS

English language translation of JP 11–231542.*
Choi, S.–J. et al.: "Design and Synthesis of New Photoresist Materials for ArF Lithograhpy", Advances in Resist Technology and Processing XVII, Proceedings of SPIE, vol. 3999, 2000, pp. 54–61.

* cited by examiner

*Primary Examiner*—Amanda Walke
(74) *Attorney, Agent, or Firm*—Laurence A. Greenberg; Werner H. Stemer; Gregory L. Mayback

(57) ABSTRACT

The invention relates to a polymer obtained by copolymerization of a first comonomer having a group catalytically cleavable by acid, a second comonomer having an anchor group for the subsequent linkage of an amplification agent, and a third comonomer having a carboxyl group being esterified with an alkyl group. It is also possible for one or more carbon atoms in the alkyl group to be replaced by oxygen. The polymer may also include fourth comonomers that include silicon-containing groups. By using the alkyl or alkoxyalkyleneoxy side groups introduced with the third comonomer, the glass transition temperature of the polymer can be reduced so that a photoresist containing the polymer provides a homogeneous polymer film on heating.

12 Claims, No Drawings

POLYMER MATERIAL HAVING A LOW GLASS TRANSITION TEMPERATURE FOR USE IN CHEMICALLY AMPLIFIED PHOTORESISTS FOR SEMICONDUCTOR PRODUCTION

BACKGROUND OF THE INVENTION

Field of the Invention

The invention relates to a polymer, a photoresist containing the polymer, and a process for structuring semiconductor substrates.

In the production of microchips, thin layers of a photoresist are used for structuring semiconductor substrates. The chemical and physical properties of the photoresist can be selectively modified by exposing the photoresist using a photomask or by direct irradiation, for example, using an electron beam. After a development step in which either the exposed or the unexposed parts of the photoresist are removed, a structured resist is obtained, which is used as a mask, for example, for etching the semiconductor substrate. During the etching, the bare parts of the substrate arranged under the photoresist are removed so that the structure predetermined by the mask is transferred to the substrate.

A photoresist suitable for the industrial production of microchips has to meet a large number of requirements. For economic reasons, exposure times that are as short as possible are desirable when transferring the structure defined by a photomask to the photoresist. To be able to achieve a comprehensive chemical modification of the photoresist with only low exposure intensities, most of the currently used resists operate with so-called chemical amplification. A Chemically Amplified Resist is referred to as a CAR. The exposure initiates a photochemical reaction which catalyzes a change in the chemical structure of the photoresist. In chemically amplified photoresists, for example, a large number of polar groups can be liberated using a single photon. In contrast to chemically unamplified photoresists, chemically amplified photoresists therefore have quantum yield of more than 100%. In the case of a positive-working chemically amplified resist, a strong acid, which results in catalytic conversion or cleavage of the resist in a subsequent heating step, is produced from a photo acid generator, for example, by the exposure. By using this chemical reaction, the solubility of the polymer in a developer is dramatically changed so that there is a substantial differentiation between the exposed and the unexposed parts. For this purpose, the polymer contained in the photoresist includes, for example, nonpolar tert-butyl carboxylate groups, from which polar carboxylic acid groups can be liberated under acid catalysis.

In order to be able to etch only the bare parts of the substrate selectively, the structured photoresist must have sufficient resistance to the etching plasma used. For this purpose, either the structured photoresist must have a sufficient layer thickness so that a sufficient layer of photoresist is present even at the end of the etching process in order to protect the semiconductor substrate sections underneath from the plasma, or the resist must have a composition such that it is not attacked by the etching plasma. Thus, in an oxygen plasma, an organic polymer which contains only carbon-containing groups is converted into volatile products so that the resist mask is relatively rapidly removed. If, however, the polymer contains silicon-containing groups, these are converted in the oxygen plasma into silicon dioxide, which forms a solid film on the substrate surface and protects the latter from removal by the plasma. The silicon-containing groups may either already be bound as groups in the polymer or they can be subsequently introduced into the polymer after the structuring. In this process variant, the structured resist is chemically amplified by introducing amplification agents. For this purpose, the polymer contained in the photoresist includes anchor groups for the linkage of amplification agents which increase the etch resistance of the photoresist. By incorporating further groups, it is possible at the same time subsequently to increase the layer thickness of the photoresist. The anchor groups must have sufficient reactivity to undergo a reaction with a suitable group of the amplification agent within as short a reaction time as possible and to bind the amplification agent to the polymer via a preferably covalent bond. Subsequent amplification of photoresists is possible, for example, by the CARL process described in Published European Patent Application EP 0 395 917 B1 (CARL= Chemical Amplification of Resist Lines). A subsequent chemical amplification of two-layer resist systems is described, for example, in U.S. Pat. No. 5,234,793. To provide anchor groups for chemical amplification, for example, maleic anhydride is incorporated as a comonomer into the polymer of the photoresist. The carboxylic anhydride group can then serve as an anchor group, which can be nucleophilically attacked, for example, by an amino group of the amplification agent. The amplification agent is then bound to the polymer of the photoresist via an amide bond. In this way, for example, subsequent incorporation of organosilicon groups into the resist structures is possible, and hence a subsequent increase in the etch stability in an oxygen plasma. This incorporation reaction is often referred to as silylation. In addition to silicon-containing groups, aromatic or polycyclic aliphatic groups can also be introduced into the polymer in order to increase the etch resistance. Introduction of aromatic groups is referred to as aromatization.

Standing times during which, for example, the substrate is transferred from one production stage to the next occur between the individual production steps. During these times, diffusion processes can occur, for example, acid, which has been liberated from the photo acid generator, diffuses from the exposed parts into the unexposed parts. On cleavage of the acid-labile groups, acid-labile groups are therefore also cleaved in those sections of the unexposed parts which are adjacent to the unexposed parts, which leads to a deterioration in the edge structure after the development, for example, to a flattening of the resist sidewalls and to roughness of the edges. Furthermore, during the standing times occurring between individual process steps, basic impurities can diffuse from the surrounding air into the resist film and neutralize some of the liberated acid there. This leads to a slower process or to incomplete elimination of the acid-labile groups. In order to improve the properties of the resist film, the resist film is generally heated briefly after application, so that the solvent evaporates. This step is also referred to as softbake. If a temperature which is above the glass transition temperature of the polymer is chosen, the polymer or the resist softens and a rearrangement of the polymer chains occurs, so that a homogeneous film is formed. Cavities of pores which are formed during application of the photoresist or during evaporation of the solvent are predominantly closed. However, if the polymer contained in the photoresist has too high a glass transition temperature, no rearrangement of the polymer chains occurs in the softbake step and the resist film still has cavities which, owing to the internal surface, form barriers to the diffusion of the liberated acid in the heating step which is carried out after the exposure (PEB=postexposure bake).

Furthermore, a film having a homogeneous structure, as obtained by heating, has a higher mechanical strength than a film having a foam-like or spongy structure. Because of the denser structure, even gaseous contaminants, which are introduced, for example, from the surrounding air, can penetrate into lower resist layers or evaporate from the resist only to a relatively small extent. The sensitivity of the resist to contaminants is thus reduced by a good film quality and pot life effects of the exposure are suppressed.

In order to reduce the glass transition temperature $T_g$ of the polymer and hence to improve the quality of the photoresist, a VEMA photoresist has been proposed by S. J. Choi, H.-W. Kim, S.-G. Woo and J.-T. Moon, Proc. SPIEE Vol. 3999 (2000), 54–61. The polymer of this resist is obtained by terpolymerization of a vinyl ether, maleic anhydride and an acrylate, which has been etherified with an acid-labile alicyclic radical, such as 8-ethyl-8-tricyclodecanyl or 2-methyl-2-adamantyl (VEMA=vinyl ether/maleic anhydride). The vinyl ether gives the carbon chain of the polymer higher flexibility, causing the glass transition temperature $T_g$ of the polymer to decrease. Because of the wide range of requirements that a photoresist for an industrial application has to meet, however, a continuous further development of the resists is necessary.

SUMMARY OF THE INVENTION

It is accordingly an object of the invention to provide a polymer, a photoresist, and a process for structuring a semiconductor substrate, which overcomes the above-mentioned disadvantages of the prior art apparatus and processes of this general type.

In particular, it is an object of the invention to provide a polymer for producing chemically amplifiable photoresists, by means of which polymer it is possible to obtain photoresist layers having a homogeneous structure and good resolution properties.

With the foregoing and other objects in view there is provided, in accordance with the invention, a polymer including: a first comonomer having a polymerizable carbon—carbon double bond and a group for being catalytically cleaved by an acid and, after being cleaved, for liberating a polar group; a second comonomer having a polymerizable carbon—carbon double bond and an anchor group for subsequently linking an amplification agent; and a third comonomer having a polymerizable carbon—carbon double bond and a carboxyl group being esterified with an alkyl group. The first comonomer, the second comonomer, and the third comonomer are copolymerized.

In accordance with an added feature of the invention, in the third comonomer, one or more carbon atoms are replaced by oxygen in an alkyl group.

In accordance with an additional feature of the invention, a fourth comonomer having a polymerizable carbon—carbon double bond and a silicon-containing group is copolymerized with the first comonomer, the second comonomer, and the third comonomer.

In accordance with another feature of the invention, the first comonomer is present in an amount from 5 to 70 mol %; the second comonomer is present in an amount from 5 to 70 mol %; the third comonomer is present in an amount from 1 to 20 mol %; and the fourth comonomer is present in an amount from 5 to 70 mol %.

In accordance with a further feature of the invention, the third comonomer is an alkyl ester of (meth)acrylic acid.

In accordance with a further added feature of the invention, the third comonomer is ethoxyethyl methacrylate.

In accordance with a further additional feature of the invention, the second comonomer is a carboxylic anhydride; and the second comonomer forms an amount of repeating units cleaved by alcohol to provide a monoester.

With the foregoing and other objects in view there is provided, in accordance with the invention, a photoresist including: the inventive polymer described above; a photo acid generator; and a solvent.

In other words, the object of the invention is achieved by a polymer obtained by the copolymerization of at least: a first comonomer which has a polymerizable carbon—carbon double bond and a group which is catalytically cleavable by acid and, after its cleavage, liberates a polar group; a second comonomer which has a polymerizable carbon—carbon double bond and an anchor group for a subsequent linkage of an amplification agent; and a third comonomer which has a polymerizable carbon—carbon double bond and a carboxyl group which is esterified with an alkyl group, it also being possible for one or more carbon atoms to be replaced by oxygen in the alkyl group.

The polymer of the inventive photoresist is prepared by copolymerization of various comonomers which perform different functions, and, independently of one another, can be varied according to the requirements.

By using the first comonomer, a group catalytically cleavable by acid is introduced into the polymer. The cleavage of this group specifically influences the polarity of the polymer and hence the solubility in the developer solution, in general an aqueous alkaline developer solution. The group catalytically cleavable by acid preferably includes a group having acidic properties, such as a carboxyl group or an acidic hydroxyl group. These acidic groups are protected by an acid-labile group via an ester or ether bond, so that their acidic properties are initially not displayed and the polymer has nonpolar properties.

The first comonomer preferably includes tert-alkyl ester, tert-butyl ester, tert-butoxycarbonyloxy, tetrahydrofuranyloxy, tetrahydropyranyloxy or acetal groups as groups catalytically cleavable by an acid. Tert-Butyl ester groups are particularly preferred. The cleavage of tert-butyl ester groups by acid catalysis results in isobutene, which, because of its high volatility, is rapidly removed from the reaction equilibrium, with the result that the reaction equilibrium is shifted in favor of the liberated carboxyl group.

The second comonomer contains an anchor group that makes it possible subsequently to bind a chemical amplification agent to the polymer of the photoresist. By using the amplification agent, the dry etch resistance of the photoresist can be subsequently increased by, for example, introducing silicon-containing groups or groups having aromatic or polycyclic moieties (partial structures) into the polymer. Furthermore, the resist profiles can be subsequently modified by the chemical amplification in order, for example, to increase the layer thickness of the photoresist or to decrease the width of the trenches arranged between the resist profiles. The anchor group is preferably susceptible to nucleophilic attack.

Comonomers customary per se for the preparation of the polymers of photoresists can be used as first and second comonomers. Suitable first and second comonomers or repeating units derived from these are described, for example, in the abovementioned Published European Patent Application EP 0 395 917.

According to the invention, the glass transition temperature of the polymer can be influenced or established by using the third comonomer. For this purpose, alkyl side groups, which are bound to the polymer main chain via an ester group, are introduced into the polymer by the third comonomer. In order to increase the adhesion of the polymer to the substrate, one or more of the carbon atoms of the alkyl side chain can also be replaced by oxygen atoms. The alkyl side groups preferably include more than 5 carbon atoms, particularly preferably from 5 to 20 carbon atoms. The alkyl groups may be branched, but linear alkyl groups are preferred. The side groups are introduced as esters of unsaturated carboxylic acids, preferably monounsaturated carboxylic acids, into the polymer chain. In this context, monounsaturated means that the carboxylic acid has at least one polymerizable carbon—carbon double bond. Suitable carboxylic acids are, for example, cyclohexenecarboxylic acid, norbornene-carboxylic acid, (meth)acrylic acid, maleic acid, itaconic acid, cyclohexenedicarboxylic acid, norbornenedicarboxylic acid and all acidic monoesters of the dicarboxylic acids with any desired alcohols. At least one of the carboxyl groups of the dicarboxylic acids are esterified with one of the alkyl groups described above which includes at least 5 carbon atoms. It is possible for individual carbon atoms with the alkyl groups also to be replaced by oxygen atoms. The acidic monoesters of the dicarboxylic acids can be prepared by alcoholysis of the corresponding acid anhydrides with suitable alcohols, for example n-hexanol. The free carboxyl groups of the acidic monoesters can optionally likewise be esterified. It is possible here also to introduce short-chain alkyl groups, for example, methyl or ethyl groups, into the ester group. Oxygen atoms can be introduced into the alkyl side group by, for example, reacting the unsaturated carboxylic acids, from which the third comonomer is to be prepared, with epoxides. After opening the epoxides, the liberated hydroxyl group can be etherified, for example, with a corresponding alkyl halide. Both the oxygen atoms of the carboxyl group and the oxygen atoms provided in the alkyl chain permit an improvement in the adhesion of the polymer to the substrate.

By means of the alkyl side groups bound to the polymer main chain via an ester group, the glass transition temperature of the polymer can be substantially reduced. Consequently, the polymer can be softened and the heating step carried after application of the photoresist film, so that an improvement in the layer quality can be achieved and hence a higher resolution of the resist. The extent to which the glass transition temperature is reduced can be influenced by the chain length of the alkyl side chains. Longer alkyl chains result in a greater reduction in the glass transition temperature.

In order to increase the etch resistance of the polymer in the oxygen plasma, the fourth comonomers which have a polymerizable carbon—carbon double bond and a silicon-containing group can be copolymerized in the preparation of the polymer. The introduction of silicon-containing groups is sufficient for introducing a considerable proportion of silicon atoms into the polymer, which are converted into $SiO_2$ during the etching in the oxygen plasma. Furthermore, such silicon-containing comonomers generally have a double bond with high electron density, so that the preparation of the polymer takes place more easily by free radical polymerization and better yields are obtained.

The preparation of the polymer is effected by customary free radical polymerization processes. The polymerization can be carried out in solution or in a solvent-free reaction system. The free radical polymerization reaction can be initiated either by high-energy radiation, for example, UV radiation, or by the addition of a free radical initiator, such as benzoyl peroxide or AIBN. The isolation and purification of the polymer, is also effected by known methods, such as, for example, by precipitation or reprecipitation.

The amounts of the individual comonomers can be varied within wide limits and thus optimized with respective lithographic application. Preferably, the first comonomer has an amount of from 5 to 70 mol %, the second comonomer has an amount of from 5 to 70 mol %, the third comonomer has an amount of from 1 to 40 mol % and the fourth comonomer has an amount of from 5 to 70 mol %, based on the polymer.

Because of their high reactivity and their economical availability, esters of (meth)acrylic acid are particularly preferred as a third comonomer. A particularly preferred third comonomer is ethoxyethyl methacrylate.

Particularly preferred anchor groups in the polymer are carboxylic anhydride groups. These are introduced into the polymer via the second comonomer, for which purpose corresponding unsaturated carboxylic anhydrides may be used. Suitable second comonomers are, for example, maleic anhydride, itaconic anhydride, norborenecarboxylic anhydride, cyclohexenedicarboxylic anhydride or methacrylic anhydride. In a preferred embodiment, an amount of repeating units formed from the second comonomer and present in the inventive polymer is cleaved by alcohol to give a monoester. This alcoholysis is preferably carried out after preparation of the polymer. Short-chain alcohols having preferably 1 to 5 carbon atoms, in particular, methanol and/or ethanol, are suitable for the alcoholysis. The carboxyl groups formed from the carboxylic anhydride increase the polarity of the polymer, with the result that it adheres better to the substrate surface. It is thus possible to produce a uniform film on the substrate surface, with the result that the structure having higher resolution can be projected onto the photoresist.

In a particularly preferred embodiment, the polymer is obtained by copolymerization of tert-butyl methacrylate, maleic anhydride, allyltrimethylsilane and ethoxyethyl methacrylate.

The inventive polymer is particularly suitable for being used in photoresists used for structuring semiconductor substrates. The invention therefore also relates to a photoresist that includes at least a polymer as has been described above, a photo acid generator, and a solvent.

Photo acid generators which may be used are all compounds which liberate acid on irradiation with a certain exposure radiation and have as high a quantum yield as possible. Ionic compounds in the form of sulfonium salts and iodonium salts are preferably used as photo acid generators. For example, onium compounds as described in Published German Patent Application DE 198 20 477 are suitable. For example, methoxypropyl acetate, oligoethylene glycol ether, cyclopentanone, cyclohexanone, γ-butyrolactone or ethyl lactate can be used as a solvent for the photoresist. Mixtures of at least two of these solvents may also be used. In general, all conventional photoresist solvents or mixtures thereof can be used, provided that a clear, homogeneous and storage-stable solution of the resist components can be prepared with them and a good layer quality of the resist film can be achieved when coating a substrate.

The components described above are used in the inventive resist, preferably in the following ratios:

film-forming polymer: from 1 to 50% by weight, preferably from 2 to 8% by weight;

photo acid generator: from 0.01 to 10% by weight, preferably from 0.05 to 0.5% by weight; and solvent: from 50 to 99% by weight, preferably from 92 to 97% by weight.

In addition to the constituents, the chemically amplified resist may also contain further customary constituents. For example, a thermo acid generator which liberates an acid on heating may be present. The temperature at which the thermo acid generator liberates an acid must be above the temperature at which the elimination of the acid-labile groups in the exposed parts of the photoresist takes place. The thermo acid generator is generally present in an amount of from 0.01 to 5% by weight, preferably from 0.05 to 1% by weight in the photoresist. Suitable thermo acid generators are, for example, benzylthiolanium compounds. Using the thermo acid generator, the acid-labile groups in the structured resist can be cleaved by heating and polar groups which act as anchor groups for the linkage of the amplification agent can thus be liberated.

In addition, further components may be introduced as additives into the photoresist. These components influence the resist system advantageously with regard to resolution, film formation properties, shelf life, radiation sensitivity, pot life effects, etc.

With the foregoing and other objects in view there is provided, in accordance with the invention, a process for structuring semiconductor substrates. The process includes steps of: providing a semiconductor substrate; providing the inventive photoresist described above; applying a layer of the photoresist to the semiconductor substrate; heating the layer of the photoresist to a temperature above a glass transition temperature of the polymer to obtain a resist film; exposing the resist film section by section to obtain an exposed resist film having a latent image formed from acid; heating the exposed resist film to obtain a contrasted resist film in which, in exposed sections, groups catalytically cleavable by acid are cleaved and polar groups are liberated on the polymer; developing the contrast resist film with a polar alkaline developer to provide a structured resist including lands and trenches configured between the lands, the substrate being bare in the trenches; and transferring a structure formed by the structured resist to the substrate.

In accordance with an added mode of the invention, the process includes adding an amplification agent to the structured resist, the amplification agent having a reactive group bound to the anchor groups.

The photoresist is first applied by conventional techniques to a semiconductor substrate, for example, by spin coating, spraying on or dip methods. A generally used semiconductor substrate is a silicon wafer, which may also already have passed through structuring steps and may therefore already include structures or microelectronic components. In this case, the conventional bottom resist, e.g. a novolak, may also first be applied in order to compensate for irregularities on the surface of the substrate and to be able to ensure reliable focusing of the radiation used for the exposure in the layer of the inventive photoresist. The layer produced from the photoresist is then heated to a temperature which is above the glass transition temperature of the polymer. The solvent is expelled from the resist and defects in the resist film are healed by softening the polymer so that a homogeneous resist film is obtained. The resist film is then exposed, a photomask being arranged in the beam path between the radiation source and the photoresist in order to project the desired structure onto the resist film. However, it is also possible to use a focused electron or ion beam, by means of which the desired structure can be written directly onto the photoresist film. As a result of the exposure, protons are liberated in the exposed parts from the photo acid generator and catalyze the cleavage of the acid-labile protective groups in the exposed parts. The acid first forms a latent image, i.e. the distribution of the acid in the photoresist corresponds to the exposed parts. As a result of the cleavage of the acid-labile groups, polar groups liberated on the polymer and the latent acid image is thus imprinted into the polymer. For acceleration of the cleavage of the acid-labile groups, the exposed resist film is heated (PEB=postexposure bake). The polymer changes its chemical character, i.e. parts in which the polymer has increased polarity are formed in the resist. The chemical profile is therefore produced in a surface of the photoresist. Since the proton liberated from the photo acid generator acts as a catalyst in the elimination of the acid-labile protective groups, a multiplicity of acid-labile protective groups can be cleaved with one liberated proton. This leads to stronger contrasting of the latent image produced by the exposure. As a result of the elimination of the acid-labile protective groups, alkali-soluble groups are liberated, such as carboxyl groups or acidic hydroxyl groups. This causes the solubility of the polymer in alkaline aqueous developers to be different in the exposed and unexposed parts of the photoresist. If the resist is therefore treated with an alkaline aqueous developer agent, for example, tetramethylammonium hydroxide, only the exposed parts are removed from the substrate. A structured resist is obtained on the substrate. The structured resist can now be used as a mask for structuring a substrate arranged under the structured resist. The substrate may be, for example, a silicon wafer itself or a bottom resist applied to the substrate. The structuring of the substrate can be effected, for example, by using an etching plasma that selectively removes only the bare substrate whereas the structured resist remains substantially unchanged on the substrate and protects it from removal by the plasma.

If the etch resistance of the structured resist is not sufficient to achieve a transfer of the structure to the substrate, the structured resist can be chemically amplified using an amplification agent. If the anchor groups are already contained in a reactive form in the polymer, for example, as a carboxylic anhydride group, the amplification agent can be applied directly to the already structured resist. If the anchor groups are present in protected form, for example, protected by an acid-labile group, these are first liberated. For this purpose, the structured resist can, for example, be exposed to a floodlight and then heated. The polar groups are thus also liberated in the unexposed parts of the photoresist and then act as anchor groups for the linkage of the amplification agent. Amplification agents which may be used are, for example, aromatic compounds which result in an increase in the layer thickness so that the time during which the structured resist is removed in an etching plasma is lengthened. Silicon-containing amplification agents for producing an $SiO_2$ film in an oxygen plasma are preferably used. The $SiO_2$ film protects the layers present underneath, for example a bottom resist, from removal by the oxygen plasma.

The amplification agent can be applied to the structured resist from the gas phase or preferably as a solution in a suitable solvent.

Suitable basic silylating reagents are amino-functionalized organosilicon compounds, such as, for example, aminosiloxanes. Particularly suitable are, for example, chain-like dimethylsiloxanes having terminal aminopropyl units and from 1 to 50, preferably from 2 to 12, silicon atoms per molecule. Such amplification agents are represented, for example, by the following general structural formula;

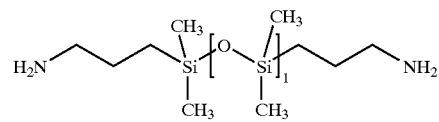

Instead of the methyl groups, it is also possible to provide other alkyl groups in the aminosiloxane, for example, ethyl or propyl groups. Further examples of amplification agents having amino-functional groups can be represented by the following general structural formula:

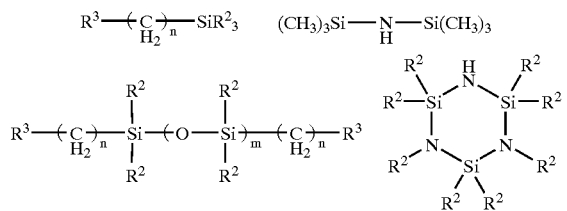

in which $R^2$=H, alkyl, aryl or cycloalkyl,

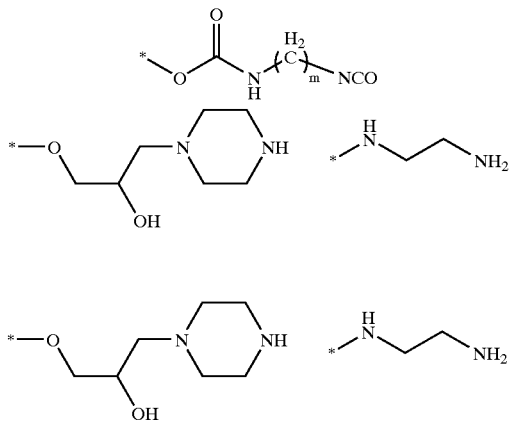

and n=1–20, m=1–20.

Silsequioxanes are also suitable as amplification agents.

If the amplification agent is applied in solution to the resist, suitable solvents are, for example, hexanol, isopropanol, heptane, decane or a mixture of at least two of these solvents. In general, however, it is possible to use all conventional nonacidic or nonbasic solvents or mixtures thereof which are capable of taking up the components of the amplification agent to give a clear, homogeneous solution having a long shelf life and which react with the anchor groups of the polymer only to a slight extent, if at all.

The reaction of the amplification agent with the anchor groups of the film-forming polymer can be improved by reaction accelerators. For example, water, low molecular weight alcohols, such as, for example, methanol or ethanol, and low molecular weight aldehydes and ketones, such as, for example, acetone, are suitable as reaction accelerators for swelling the structured resist and for stabilizing the reaction products.

DESCRIPTION OF THE PREFERRED EMBODIMENTS

The invention is explained in more detail below with reference to several examples.

EXAMPLE 1

Synthesis of the Polymer

The synthesis of the polymer is shown schematically below.

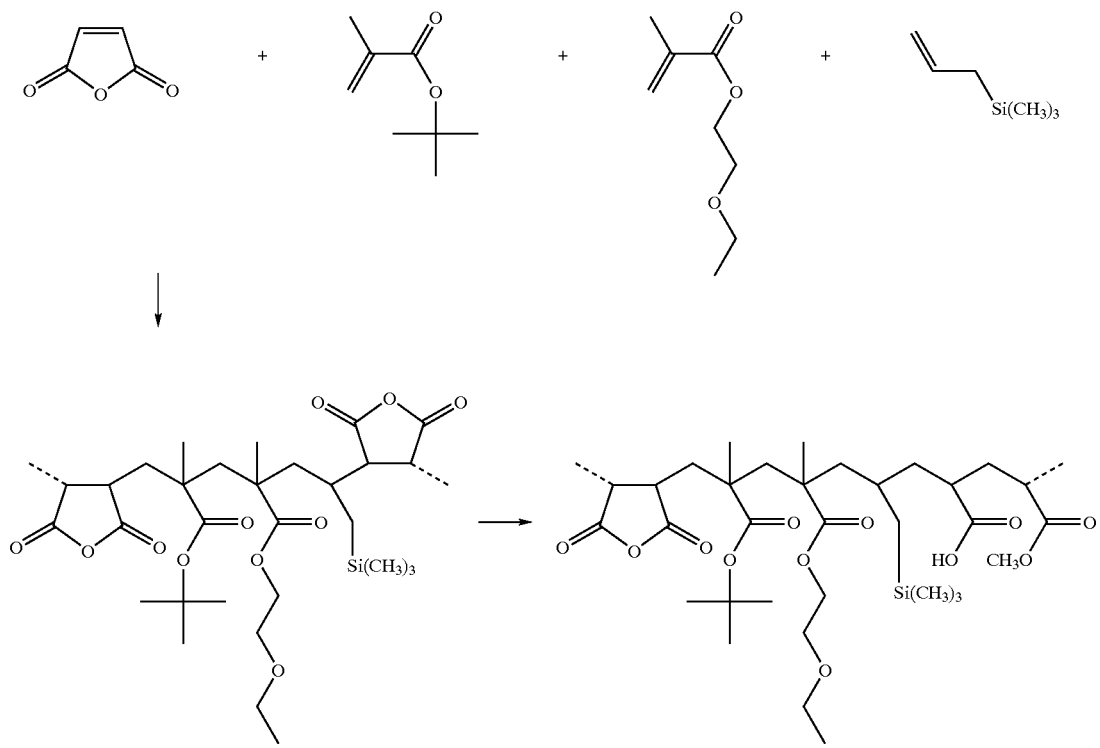

The polymer is synthesized by using free radical polymerization. For this purpose, 20.5 g (209 mmol) of maleic anhydride, 23.8 g (167 mmol) of tert-butyl methacrylate, 3.3 g (21 mmol) of 2-ethoxyethyl methacrylate, 2.4 g (21 mmol) of allyltrimethylsilane, 0.69 g (4.2 mmol) of α,α'-azoisobutyronitrile as a free radical initiator and 0.34 g (1.7 mmol) of dodecyl mercaptan as a chain regulator are dissolved in 40 g (50 ml) of 2-butanone and refluxed (80° C.) for 3 hours. Thereafter, 4.0 g (5.0 ml) of methanol (for partial alcoholysis of the anhydride) are added and the reaction solution is refluxed (80° C.) for a further 24 hours. The reaction solution is allowed to cool to room temperature and 35.0 g (27.5 ml) of 2-propanol are added with vigorous stirring. The solution obtained is added dropwise to a solution of 10.5 g (13.1 ml) of 2-butanone, 337.0 g (429 ml) of 2-propanol and 329.0 g (329.0 ml) of water in the course of 30 minutes with very vigorous mechanical stirring. During this procedure, the polymer precipitates as a fine, white powder. Stirring is continued for a further 30 minutes and the solvent is then filtered off with suction under slightly reduced pressure through a G3 frit. The white precipitate is washed with a solution of 16.0 g (20.0 ml) of 2-butanone, 111.0 g (141 ml) of 2-propanol and 100.0 g (100 ml) of water and dried for 72 hours at 80° C. in a high vacuum. About 40 g (80% of theory) of fine, white powder are obtained as a reaction product.

EXAMPLE 2

Production of a Photoresist

In this example, 8% by weight of a polymer obtained in example 1 are dissolved in 5% by weight, based on the solid polymer, of the N-phthalimide ester of paratoluenesulfonic acid in 92% by weight of 1-methoxy-2-propyl acetate.

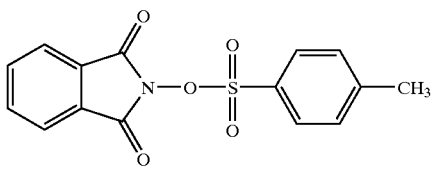

N-Phthalimide ester of paratoluenesulfonic acid

EXAMPLE 3

Production of a Photoresist Film

A novolak (TOK BLC001) dissolved in 2-methoxypropyl acetate is applied as a bottom resist to a silicon wafer for 20 seconds at 2,000 revolutions per minute. The solvent is then evaporated by heating to 110° C. for 90 seconds. The temperature is then increased to 235° C. for 90 seconds in order to crosslink the novolak. An approximately 500 nm thick plastics layer (bottom resist) which has high chemical resistance is obtained. The photoresist obtained in example 2 is applied to the bottom resist at 2,000 revolutions per minute for 20 seconds, as an upper resist layer. The solvent of the upper resist layer is evaporated by heating to 140° C. for 60 seconds. In addition, this temperature, which is above the glass transition temperature ($T_g$) of the polymer prepared in example 1, results in a very compact arrangement of the polymer macromolecules.

EXAMPLE 4

Optical Structuring

The photoresist film obtained in example 3 is exposed to a wavelength of 248 nm using an MJB 3 contact exposure unit from Karl Suess by using a chrome-on-glass mask, having different transmissions (gray wedge), through a polychromatic filter. Here, the dose is determined by the lamp power and the exposure time. The sample is then heated to 140° C. for 60 seconds. At this temperature, the chemical amplification reaction takes place. The protons produced by the irradiation cleave the acid-labile groups of the polymer in a catalytic reaction. In the following development step, the polar polymer chains or polymer fragments are dissolved away by the aqueous, alkaline developer. The development time is 1 minute.

Thereafter, washing with water is effected for 20 seconds and nitrogen is used for blowing dry. A commercially available developer (TMA 238 WA, JSR), a 2.38% strength by weight aqueous, alkali tetramethylammonium hydroxide solution, was used for the development.

For the amplification of the structured resist, the developed sample was immersed in a silylating solution for 200 seconds at 23° C. and then washed with 2-propanol and dried at 100° C. for 60 seconds. The silylating solution consists of 98% by weight of n-hexanol and 2% by weight of diaminopropyloligosiloxane. The structures of the structured resist experience a growth in layer thickness of about 60 nm and the structure edges are smoothed. The structures produced are finally transferred to the bottom resist by means of an oxygen plasma.

EXAMPLE 5

Structuring Using Electron Beam Lithography

The photoresist film obtained in example 3 is written on by using an electron beam using a Jeol JSM 840A scanning electron, microscope that is coupled to a Sietec Nanobeam chart recorder. The acceleration voltage is 30 keV and the irradiation dose is about 40 $\mu C/cm^2$. The sample is then heated to 140° C. for 60 seconds to cleave the acid-labile groups. The acid protons produced by the electron beams cleave the acid-labile groups acting as dissolution inhibitors, in a catalytic reaction. The polar polymer chains of the polymer fragments are dissolved away from the heated resist film by an aqueous alkaline developer in the subsequent development step. Structures down to a fineness of 100 nm are produced. The development step takes 1 minute. Thereafter, washing with water is effected for 20 seconds and nitrogen is used for blowing dry. The developer used was a commercially available developer TMA 238 WA, JSR.

For the chemical amplification of the chemically amplified resist, the developed sample was immersed for 200 seconds at 23° C. in a silylating solution, then washed with 2-propanol and dried at 100° C. for 60 seconds. The silylating solution consists of 98% by weight of n-hexanol and of 2% by weight of diaminopropyloligosiloxane. The resist lines obtained after the development have a width of 100 nm are expanded to about 140 nm and the line edges are smoothed. The structure obtained is transferred to the bottom resist using an oxygen plasma.

COMPARATIVE EXAMPLE

A polymer was prepared from maleic anhydride, allyltrimethylsilane, and tert-butyl methacrylate analogously to example 1. The glass transition temperature $T_g$ and the exposure dose $D_0$ are shown in table 1. $D_0$ denotes the minimum irradiation dose that is required to effect a sufficient change in the photoresist for the latter to be soluble in the aqueous developer. Do can be determined, for example, by using a gray wedge, a mask having sections with different transmissions being used.

TABLE 1

Comparison of the polymer from examples 1 and 5

| Polymer composition/mol % | $T_g/°C$ | $D_0$ (mJ/cm$^2$) |
|---|---|---|
| 50 MA, 27.5 AS, 22.5 t-Bu | 148.15 | 23.5 |
| 50 MA, 22.5 AS, 22.5 t-Bu, 5 EE | 129.34 | 21.1 |

MA: Maleic anhydride
AS: Allyltrimethylsilane
t-Bu: tert-Butyl methacrylate
EE: Ethoxyethyl methacrylate Table 1 shows that the inventive photoresist has an exposure sensitivity comparable to that of conventional photoresists, but has a substantially lower glass transition temperature. Thus, the inventive photoresist can be exposed and developed in the same way as photoresists customary to date, but because of the lower glass transition temperature $T_g$, a higher quality of the resist film can be achieved by heating, and hence the structures produced in the resist have a higher quality, for example, less roughness of the edges of the resist lands.

We claim:

1. A polymer, comprising:
   a first comonomer having a polymerizable carbon—carbon double bond and a group for being catalytically cleaved by an acid and, after being cleaved, for liberating a polar group;
   a second comonomer having a polymerizable carbon—carbon double bond and an anchor group for subsequently linking an amplification agent; and
   a third comonomer having a polymerizable carbon—carbon double bond and a carboxyl group being esterified with an alkyl group;
   said first comonomer, said second comonomer, and said third comonomer being copolymerized for UV-lithography.

2. The polymer according to claim 1, wherein in said third comonomer, one or more carbon atoms are replaced by oxygen in an alkyl group.

3. The polymer according to claim 1, comprising a fourth comonomer having a polymerizable carbon—carbon double bond and a silicon-containing group being copolymerized with said first comonomer, said second comonomer, and said third comonomer.

4. The polymer according to claim 3, wherein:
   said first comonomer is present in an amount from 5 to 70 mol %;
   said second comonomer is present in an amount from 5 to 70 mol %;
   said third comonomer is present in an amount from 1 to 20 mol %; and
   said fourth comonomer is present in an amount from 5 to 70 mol %.

5. The polymer according to claim 1, wherein:
   said first comonomer is present in an amount from 5 to 70 mol %;
   said second comonomer is present in an amount from 5 to 70 mol %; and
   said third comonomer is present in an amount from 1 to 20 mol %.

6. The polymer according to claim 1, wherein said third comonomer is an alkyl ester of (meth)acrylic acid.

7. The polymer according to claim 1, wherein said third comonomer is ethoxyethyl methacrylate.

8. The polymer according to claim 1, wherein said second comonomer is a carboxylic anhydride; and said second comonomer forms an amount of repeating units cleaved by alcohol to provide a monoester.

9. The polymer according to claim 1, comprising:
   a fourth comonomer;
   said first comonomer, said second comonomer, said third comonomer, and said fourth comonomer defining a copolymerized combination of tert-butyl methacrylate, maleic anhydride, allyltrimethylsilane and ethoxyethyl methacrylate.

10. A photoresist, comprising:
    a UV-lithography polymer including:
       a first comonomer having a polymerizable carbon—carbon double bond and a group for being catalytically cleaved by an acid and, after being cleaved, for liberating a polar group,
       a second comonomer having a polymerizable carbon—carbon double bond and an anchor group for subsequently linking an amplification agent, and
       a third comonomer having a polymerizable carbon—carbon double bond and a carboxyl group being esterified with an alkyl group, said first comonomer, said second comonomer, and said third comonomer being copolymerized for UV-lithography;
    a photo acid generator; and
    a solvent.

11. A process for structuring semiconductor substrates, which comprises:
    providing a semiconductor substrate;
    providing a photoresist including:
       a UV-lithography polymer having a first comonomer having a polymerizable carbon—carbon double bond and a group for being catalytically cleaved by an acid and, after being cleaved, for liberating a polar group, a second comonomer having a polymerizable carbon—carbon double bond and an anchor group for subsequently linking an amplification agent, and a third comonomer having a polymerizable carbon—carbon double bond and a carboxyl group being esterified with an alkyl group, the first comonomer, the second comonomer, and the third comonomer being copolymerized for UV-lithography;
       a photo acid generator; and
       a solvent;
    applying a layer of the photoresist to the semiconductor substrate;
    heating the layer of the photoresist to a temperature above a glass transition temperature of the polymer to obtain a resist film;
    exposing the resist film to a UV-light section by section to obtain an exposed resist film having a latent image formed from acid;
    heating the exposed resist film to obtain a contrasted resist film in which, in exposed sections, groups catalytically cleavable by acid are cleaved and polar groups are liberated on the polymer;

developing the contrast resist film with a polar alkaline developer to provide a structured resist including lands and trenches configured between the lands, the substrate being bare in the trenches; and transferring a structure formed by the structured resist to the substrate.

12. The process according to claim 9, which comprises adding an amplification agent to the structured resist, the amplification agent having a reactive group bound to the anchor groups.

* * * * *